(12) United States Patent
Wu

(10) Patent No.: US 7,457,173 B2
(45) Date of Patent: Nov. 25, 2008

(54) AREA EFFICIENT DIFFERENTIAL EEPROM CELL WITH IMPROVED DATA RETENTION AND READ/WRITE ENDURANCE

(75) Inventor: Xiaoju Wu, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/132,088

(22) Filed: May 18, 2005

(65) Prior Publication Data

US 2006/0262599 A1    Nov. 23, 2006

(51) Int. Cl.
  *G11C 7/00* (2006.01)
  *G11C 7/22* (2006.01)
(52) U.S. Cl. .................. 365/189.15; 365/156
(58) Field of Classification Search .......... 365/156, 365/189.15

See application file for complete search history.

(56) References Cited

U.S. PATENT DOCUMENTS

| 5,018,102 A | 5/1991 | Houston |
| 5,412,599 A * | 5/1995 | Daniele et al. ......... 365/185.14 |
| 5,566,110 A | 10/1996 | Soenen et al. |
| 6,590,798 B1 | 7/2003 | Komatsuzaki |
| 6,841,447 B1 * | 1/2005 | Logie et al. .................. 438/264 |

* cited by examiner

*Primary Examiner*—Huan Hoang
*Assistant Examiner*—Kretelia Graham
(74) *Attorney, Agent, or Firm*—Jacqueline J. Garner; W. James Brady, III; Frederick J. Telecky, Jr.

(57) ABSTRACT

An electrically erasable programmable read only memory (EEPROM) (500) is disclosed having improved data retention and read/write endurance. The EEPROM also lacks a more conventional cross coupling arrangement and thus is more area efficient than conventional EEPROM cells. The EEPROM (500) includes a PMOS transistor portion (514a) and an NMOS transistor portion (514b), where respective currents of these devices are compared to one another (e.g., subtracted) to give a differential reading that provides for the state of the EEPROM (500).

17 Claims, 7 Drawing Sheets

AREA EFFICIENT DIFFERENTIAL EEPROM CELL WITH IMPROVED DATA RETENTION AND READ/WRITE ENDURANCE

FIELD OF INVENTION

The present invention relates generally to memory for electronic systems and the like, and in particular to an area efficient differential electrically erasable programmable read only memory (EEPROM) having improved data retention and read/write endurance.

BACKGROUND OF THE INVENTION

Many different types of memory exist to store data for computers and the like. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to provide for data storage.

Each type of memory has its own particular advantages and disadvantages. For example, DRAM and SRAM allow individual bits of data to be erased one at a time, but such memory loses its data when power is removed. EPROM is relatively inexpensive and dense, but lacks erasability. EEPROM is desirable because it can be easily erased without requiring extra exterior equipment. EEPROM may, however, be somewhat deficient with regard to read/write endurance, data retention and/or area efficiency. Read/write endurance (e.g., wear out) and data retention (e.g., charge loss) generally refer to lifespan aspects of the memory, while area efficiency refers to a cost aspect of the memory.

Read/write and/or erase operations are generally performed in EEPROM by applying certain voltages to particular terminals of the memory cells. In a write or erase operation, for example, the voltages are applied to cause charge to be stored in or removed from a memory cell. In a read operation, on the other hand, appropriate voltages are applied so as to cause a current to flow in the cell, where the amount of current is a function of the amount of charge stored within the cell, among other things. The resulting current flow thus provides an indication of the amount of charge stored within the cell, which in turn corresponds to a state of the cell. For example, a certain amount of charge can correspond to a high data state which can be designated as a logic high or a binary data bit "1". Similarly, a lesser amount of stored charge can correspond to a low state which can be designated as a logic low or a binary data bit "0". Accurate data determinations and/or manipulations are thus dependent upon the ability of a memory cell to sustain a charge over time (e.g., data retention), as well as the cell's ability to withstand repeated applications of voltages to read, write and/or erase the memory cell (e.g., endurance).

As with other types of memory, EEPROM is generally formed upon a semiconductor substrate. It can be appreciated that semiconductor 'real estate' is somewhat valuable. Therefore, it is desirable to fabricate as many EEPROM cells on a semiconductor wafer (or a die on a wafer) as possible. Accordingly, the more semiconductor substrate an individual EEPROM cell requires, the less area efficient that cell is. Nevertheless, for EEPROM, as well as other types of memory cells, to be practical, they are generally organized into addressable units or groups, generally referred to as arrays, and are accessible for read, write and/or erase operations. The cells are, for example, commonly organized into bytes which comprise eight cells—one bit per cell—and words which may include sixteen or more cells, usually configured in multiples of eight. A length of memory cells containing such respective binary bits can be strung together to store data, such as an 8 bit word, for example. It can thus be appreciated that it is important to mitigate area inefficiencies in memory cells since the cells are commonly arranged in arrays, which can magnify or multiply such area inefficiencies.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention pertains to an area efficient differential electrically erasable programmable read only memory (EEPROM) having improved data retention and read/write endurance. The EEPROM cell lacks a more conventional cross coupling arrangement and thus is more area efficient than conventional EEPROM cells. The EEPROM cell includes a PMOS and an NMOS transistor, where respective currents of these transistors are compared to one another (e.g., subtracted) to give a differential reading that provides for improved read/write endurance and data retention.

According to one or more aspects of the present invention, an electrically erasable programmable read only memory (EEPROM) is disclosed. The EEPROM includes a tunneling region, a read transistor, a control region and a patterned layer of semiconductor material. The tunneling region has a p moat region and an n moat region. The read transistor is operatively coupled to the tunneling region, and includes a pmos transistor portion comprising a p moat region, and an nmos transistor portion comprising an n moat region. The control region is operatively coupled to the read transistor, and has a p moat region and an n moat region. The patterned layer of semiconductor material serves to operatively couple the tunneling region and the control region to the read transistor.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
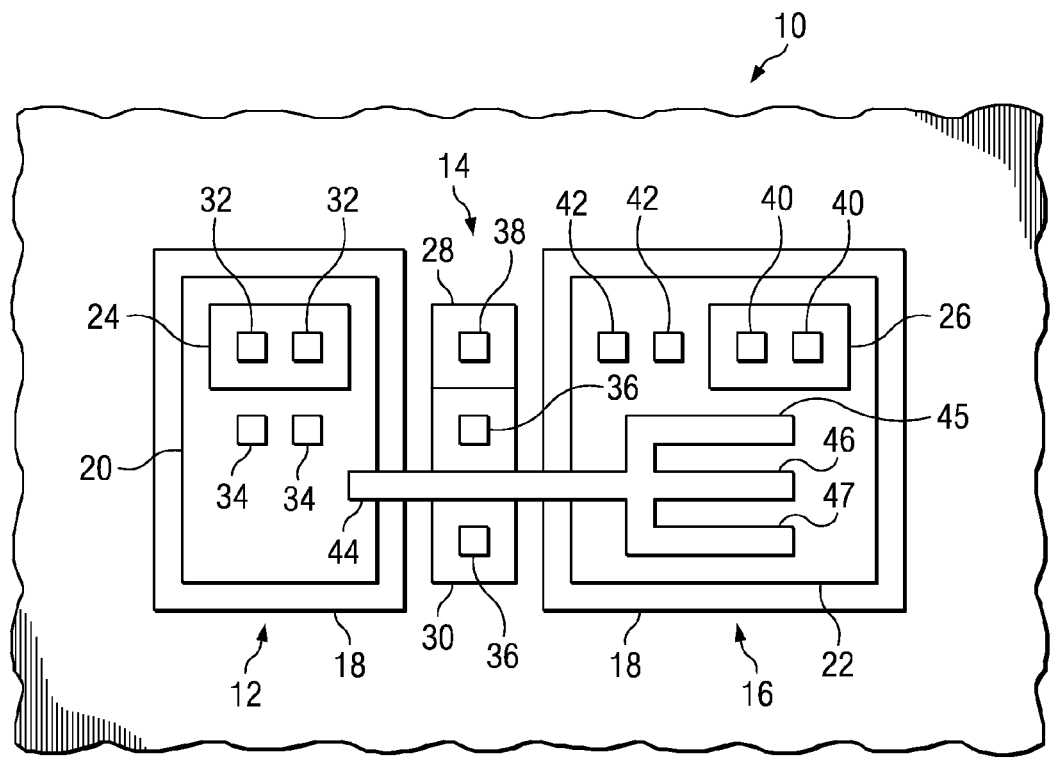
FIG. 1 is a top plan view illustrating a conventional non cross coupled EEPROM cell.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, known structures and devices are shown in block diagram form in order to facilitate describing one or more aspects of the present invention.

The present invention pertains to an area efficient differential electrically erasable programmable read only memory (EEPROM) having improved data retention and read/write endurance. The disclosed EEPROM is more area efficient than conventional EEPROM cells because it does not comprise a cross coupled arrangement. Further, the EEPROM has improved read/write endurance and data retention because it comprises PMOS and NMOS transistors, where respective currents of these transistors are compared to one another (e.g., subtracted) to give a differential reading that is indicative of the state of the cell.

Turning to FIG. 1, a top plan view illustrates a conventional non cross coupled EEPROM cell 10. The EEPROM cell 10 comprises a tunneling region 12, a read transistor 14 and a control region 16, where all three of these regions are formed upon a semiconductor substrate (not shown). The tunneling region 12 and the control region 16 are formed within an n well 18. Within the n well 18, the tunneling region 12 and the control region 16 have respective p moats 20, 22 and n moats 24, 26. The read transistor 14 similarly has a p moat 28 and an n moat 30, where the p and n moats are merely regions that are doped with particular concentrations of p and n type dopants, respectively.

One or more respective contacts 32, 34 are formed within the tunneling region 12 to provide a mechanism for operatively coupling to the n and p moats 24, 20, respectively. Likewise, one or more contacts 36, 38 and 40, 42 are similarly formed within the read transistor 14 and the control region 16 to provide for operatively coupling to the respective n and p moats 30, 28 and 26, 22 of these regions 14, 16. This, for example, allows source and drain regions of the transistor 14 to be contacted. Finally a patterned layer of polysilicon 44 is established between the tunneling region 12, read transistor 14 and the control region 16. More particularly, the patterned polysilicon 44 couples the p moat regions 20, 22 of the tunneling region 12 and the control region 16 through the n moat region of the read transistor 14, where the polysilicon 44 generally serves as a gate electrode for the read transistor 14. In the illustrated example, the polysilicon 44 has three 'fingers' 45, 46, 47 in the control region 16 to overlap more of the p moat 22 in that region 16.

Figure 2:
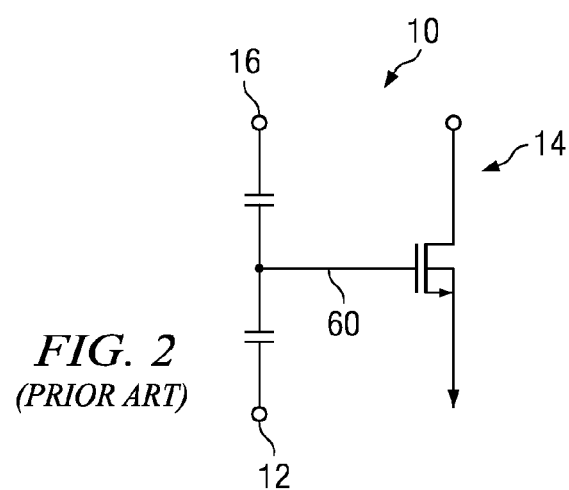
FIG. 2 is a circuit schematic illustrating a conventional non cross coupled EEPROM cell, such as the cell depicted in FIG. 1.

FIG. 2 is a circuit schematic illustrating a conventional non cross coupled EEPROM cell, such as the cell 10 depicted in FIG. 1. Accordingly, similar reference characters are used in FIG. 2. The gate 60 of the read transistor 14, which is an nmos transistor in the illustrated example, is operatively coupled between the control region 16 and the tunneling region 12. The operation of the EEPROM cell 10 is as follows:

To program the cell 10, the read transistor 14 and the tunneling region 12 are coupled to ground, while the control region 16 has a particular program voltage (VP) applied thereto;

To erase the cell 10, the read transistor 14 and the control region 16 are coupled to ground, while the tunneling region 12 has an erase voltage (VE) applied thereto; and To read the cell 10, the control region 16 and the tunneling region 12 are coupled to ground, while the read transistor 14 has a read voltage (VR) applied thereto.

Figure 3:
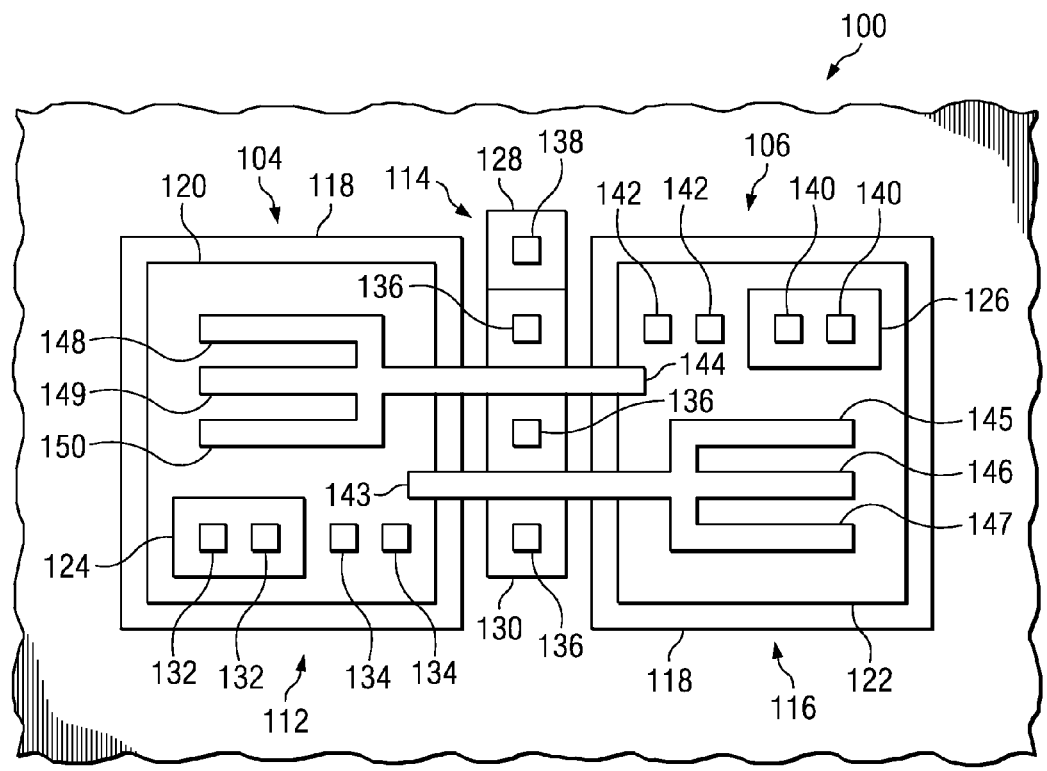
FIG. 3 is a top plan view illustrating a conventional cross coupled EEPROM cell.

Turning to FIG. 3, a top plan view illustrates a conventional cross coupled EEPROM 100. Many of the elements, features, aspects, etc. in FIG. 3 are similar to those in FIG. 1 and thus are referenced with similar reference characters. The cross coupled EEPROM 100 can be said to include a first cell 104 and a second cell 106. The EEPROM 100 has first and second regions 112, 116 that mirror one another, and that each serve dual functions of operating as a tunneling region and control region, depending on the state of the cells. A read transistor 114 is interposed between the first and second tunneling/ control regions 112, 116. The read transistor 114 serves as both a first read transistor 114a and a second read transistor 114b (e.g., once for each of the first and second tunneling/ control regions 112, 116), depending on the state of the cells.

The dual tunneling/control regions 112, 116 are formed within an n well 118 on a semiconductor substrate (not shown). Regions 112, 116 have respective p moats 120, 122 and n moats 124, 126. The read transistor 114 similarly has a p moat 128 and an n moat 130. One or more contacts 132, 134 are formed within the first tunneling/control region 112 to provide a mechanism for operatively coupling to the n and p moats 124, 120, respectively. Similarly, one or more contacts 140, 142 are formed within the second tunneling/control region 116 to provide a mechanism for operatively coupling to the n and p moats 126, 122, respectively. Likewise, one or more contacts 136, 138 are formed within the read transistor 114 to provide for operatively coupling to the n and p moats 130, 128, respectively, of the transistor 114. This, for example, allows source and drain regions of the transistor 114 to be contacted.

First and second patterned layers of polysilicon 143, 144 are established between the first and second tunneling/control regions 112, 116 and over the read transistor 114. In the illustrated example, the first patterned layer of polysilicon 143 has three fingers 145, 146, 147 in the p moat 122 of the second tunneling/control region 116, while the second patterned layer of polysilicon 144 has three fingers 148, 149, 150 in the p moat region 120 of the first tunneling/control region 112. The first and second patterned layers of polysilicon 143, 144 couples the first and second tunneling/control regions 112, 116 to one another through the n moat region 130 of the read transistor 114, where the first and second layers of polysilicon 143, 144 generally serve as respective gate electrodes for the read transistor 114.

Figure 4:
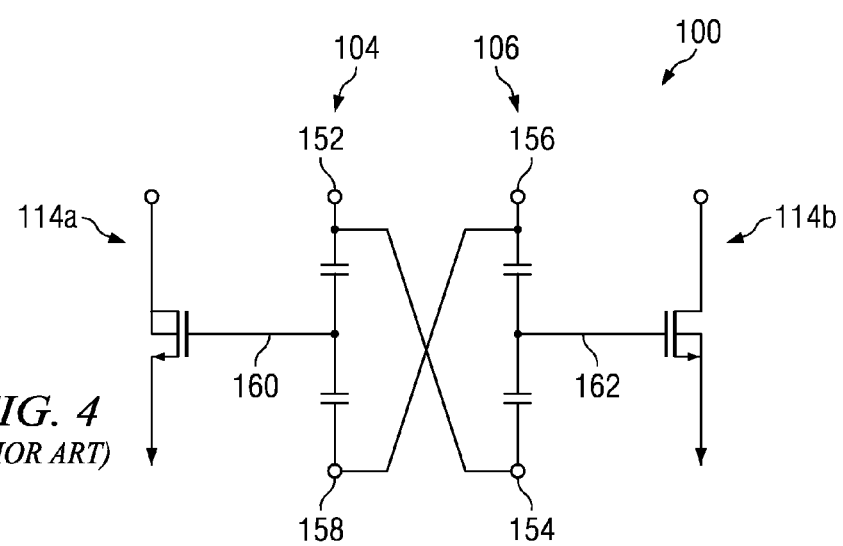
FIG. 4 is a circuit schematic illustrating a conventional cross coupled EEPROM cell, such as the cell depicted in FIG. 3.

FIG. 4 is a circuit schematic illustrating a conventional cross coupled EEPROM cell, such as the cell 100 depicted in FIG. 3. Accordingly, similar reference characters are used in FIG. 4. The first and second cells 104, 106 are cross coupled to one another. More particularly, a first control region 152 is cross coupled to a second tunneling region 154, and a second control region 156 is cross coupled to a first tunneling region 158. Gate 160 of the first read transistor 114a is operatively coupled between the first control region 152 and the first tunneling region 158 of the first cell 104. Similarly, gate 162 of the second read transistor 114b is operatively coupled between the second control region 156 and the second tunneling region 154 of the second cell 106. The operation of the EEPROM cell 100 is as follows:

To program the EEPROM 100, the first read transistor 114a, the second read transistor 114b and the second control region 156 are coupled to ground, while the first control region 152 has a particular program voltage (VP) applied thereto;

To erase the EEPROM 100, the first read transistor 114a, the second read transistor 114b and the first control region 152 are coupled to ground, while the second control region 156 has an erase voltage (VE) applied thereto; and To read the EEPROM 100, the first control region 152 and the second control region 156 are coupled to ground or a read voltage (VR) is applied to a control gate with VR applied to the first read transistor 114a and the second read transistor 114b. The stat of the EEPROM 100 is then determined differentially.

It can be appreciated that the non cross coupled arrangement illustrated in FIG. 1 is more area efficient than that presented in FIG. 3 since its physical layout is generally smaller. However, the cross coupled arrangement of FIG. 3 is more robust against charge loss and wear out (e.g., data retention and endurance) and is thus more desirable in these respects. In the cross coupled arrangement, for example, the cross coupled transistors operate in a 'mirrored' fashion such that when one transistor is on the other is off and vice versa. 'Switching' the transistors in this manner extends the life of the transistors by giving one a 'rest' while the other is on. Accordingly, this also serves to extend the useful life of the EEPROM 100.

Figure 5:
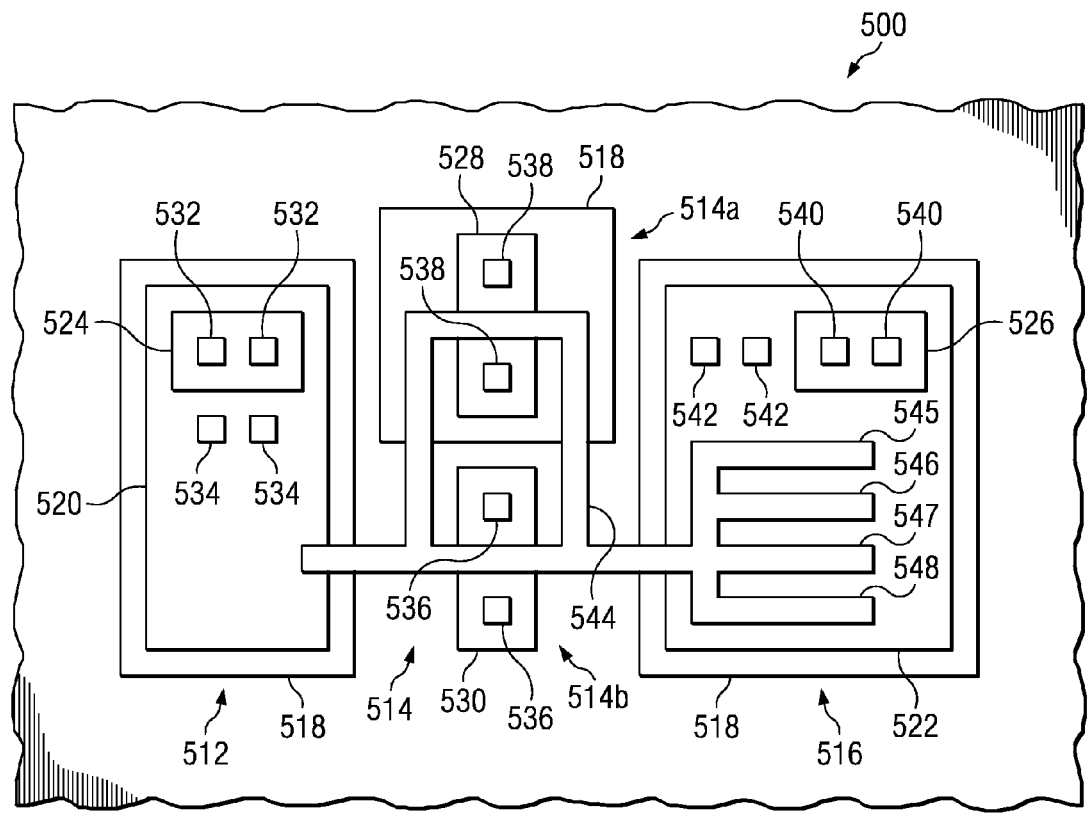
FIG. 5 is a top plan view illustrating a non cross coupled EEPROM cell according to one or more aspects of the present invention.

Turning to FIG. 5, a top plan view illustrates a non cross coupled EEPROM cell 500 according to one or more aspects of the present invention. The EEPROM 500 is more area efficient than conventional cross coupled arrangements, but nevertheless remains robust against charge loss and wear out. The EEPROM 500 described herein thus concurrently provides good data retention and endurance along with area efficiency. The EEPROM cell 500 comprises a tunneling region 512, a read transistor 514 and a control region 516, where all three of these regions are formed upon a semiconductor substrate (not shown). It is to be appreciated that 'substrate' as used herein is intended to include a semiconductor substrate, an epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith.

The read transistor 514 generally comprises a pmos transistor portion 514a and an nmos transistor portion 514b. The transistors 514a, 514b of the read transistor 514 are generally low voltage transistors, which is desirable so that power requirements are reduced. Additionally, it can be appreciated that using low VT read transistors effectively reduces the "undetectable dead-window" size toward the end of the product lifetime. Thus, the usage of the low VT MOS is expected to be more robust against charge loss and has better data retention. The transistors may, for example, operate at voltages of about 1.5 to about 5 volts. The tunneling region 512, the pmos transistor portion 514a and the control region 516 are formed within an n well 518 (e.g., an active area of the substrate that has been implanted with a certain concentration of an n type dopant). Within the n well 518, the tunneling region 512 and the control region 516 have respective p moats 520, 522 and n moats 524, 526. The pmos transistor portion 514a of the read transistor 514 similarly has a p moat 528 within the n well 518, while the nmos transistor portion 514b of the read transistor 514 has an n moat 530, where the p and n moats are merely regions that are doped with particular concentrations of p and n type dopants, respectively. It is to be appreciated that a back gate tie is not illustrated in FIG. 5 for the pmos transistor portion 514a nor the nmos transistor portion 514b of the read transistor 514.

One or more respective contacts 532, 534 are formed within the tunneling region 512 to provide a mechanism for operatively coupling to the n and p moats 524, 520, respectively. Likewise, one or more contacts 536, 538 and 540, 542 are similarly formed within the read transistor 514 and the control region 516 to provide for operatively coupling to the respective n and p moats 530, 528 and 526, 522 of these regions 514, 516. This, for example, allows source and drain regions of the pmos and nmos transistor portions 514a, 514b of the read transistor 14 to be contacted.

Finally a patterned layer of semiconductor material 544 is established between the tunneling region 512, pmos and nmos portions 514a, 514b of the read transistor 514 and the control region 516. The patterned layer of semiconductor material 544 can comprise any suitable materials, such as a polysilicon based material, for example. Additionally, as with all layers and/or features described herein (unless specifically indicated otherwise), the layer of semiconductor material 544 can, at least partially, be patterned via lithographic techniques, where lithography generally refers to processes for transferring one or more patterns between various media. In lithography, a radiation sensitive resist coating is formed over one or more layers which are to be treated in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The pattered resist can then serve as a mask for the underlying layers which can then be selectively treated, such as to receive dopants and/or to undergo etching, for example.

The patterned layer of semiconductor material 544 operatively couples the p moat regions 520, 522 of the tunneling region 512 and the control region 516 to one another. More particularly, material 544 couples regions 520, 522 to one another through both the n moat 530 of the nmos transistor portion 514b of the read transistor 14 and the p moat 528 of the pmos transistor portion 514a of the read transistor. In this manner, the patterned layer of semiconductor material 544 serves as a gate electrode for the pmos transistor 514a as well for the nmos transistor 514b. In the illustrated example, the patterned layer of semiconductor material 544 has four 'fingers' 545, 546, 547, 548 in the control region 516 to overlap more of the p moat 522 in that region 516. By way of example, each of the four fingers 545, 546, 547, 548 in the p moat 522 of the control region 516 can between about 4.5 microns and about 6.5 microns long and between about 0.3 microns and about 0.5 microns wide, whereas the material 544 may merely be between about 0.5 microns to about 0.8 microns long and between about 0.3 and about 0.5 microns wide in the p moat 520 in the tunneling region 512. Although not illustrated, it will be appreciated that a similarly patterned thin layer of dielectric material (e.g., an oxide based material) underlies the patterned layer of semiconductor material 544 to serve as a gate dielectric in the pmos and nmos transistors 514a, 514b.

Figure 6:
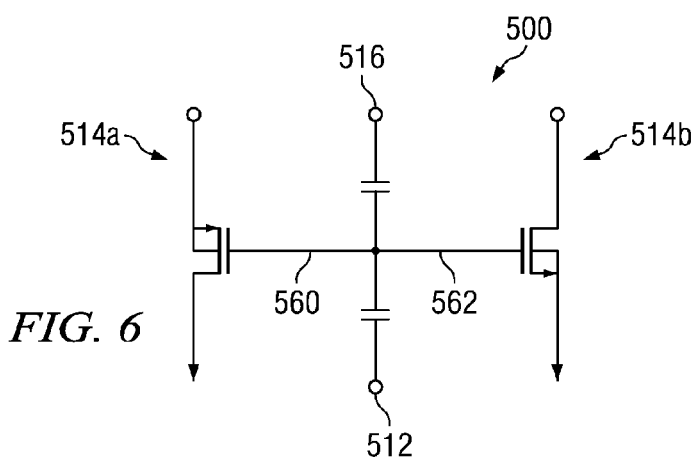
FIG. 6 is a circuit schematic illustrating a non cross coupled EEPROM cell according to one or more aspects of the present invention, such as the cell depicted in FIG. 5.

FIG. 6 is a circuit schematic illustrating a non cross coupled EEPROM cell according to one or more aspects of the present invention, such as the cell 500 depicted in FIG. 5. Accordingly, similar reference characters are used in FIG. 6. The gate 560 of the pmos transistor portion 514a of the read transistor 14 is operatively coupled between the control region 516 and the tunneling region 512. The gate 562 of the nmos transistor portion 514b of the read transistor 14 is similarly operatively coupled between the control region 516 and the tunneling region 512. The operation of the EEPROM cell 500 is as follows:

To program the cell 500, the pmos transistor 514a, the nmos transistor 514b and the tunneling region 512 are coupled to ground, while the control region 516 has a particular program voltage (VP) applied thereto;

To erase the cell 500, the nmos transistor 514a, the pmos transistor 514b and the control region 516 are coupled to ground, while the tunneling region 512 has an erase voltage (VE) applied thereto; and To read the cell 500, the control region 516 is coupled to ground or a read voltage (VR) is applied to a control gate and the tunneling region 512 is coupled to ground, while the nmos transistor and the pmos transistor 514a, 514b has a read voltage (VR) applied thereto.

Figure 7:
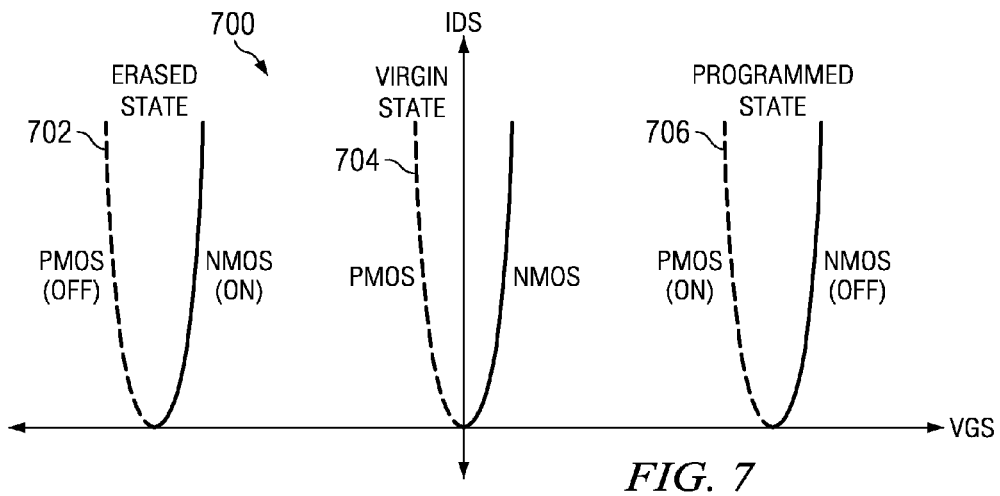
FIG. 7 is a voltage versus current graph illustrating exemplary curves for different states of a non cross coupled EEPROM cell in accordance with one or more aspects of the present invention.

Turning to FIG. 7, a voltage versus current graph 700 illustrates exemplary curves for different states of a non cross coupled EEPROM cell according to one or more aspects of the present invention. In particular, respective curves 702, 704, 706 are illustrated for erased, virgin and programmed states. Portions of the curves corresponding to the nmos device 514a are depicted by a solid line, while portions of the curves corresponding to the pmos device 514b are presented in phantom.

The threshold voltage (Vt) of the nmos device 514a increases in the programmed state 706 so that the nmos device is off in this state. The Vt for the pmos device 514b is greater than zero in the programmed state so that the pmos device is on in this state. In the erased state 702, the Vt for the nmos device 514a is less than zero so that the nmos device is on in this state. The Vt decreases, however, for the pmos device 514b in this state so that the pmos device is off in this state. In this configuration, the cell is read or rather the state of the cell is determined differentially by subtracting the current in the pmos device (Ipmos) from the current in the nmos device (Inmos).

Figure 8:
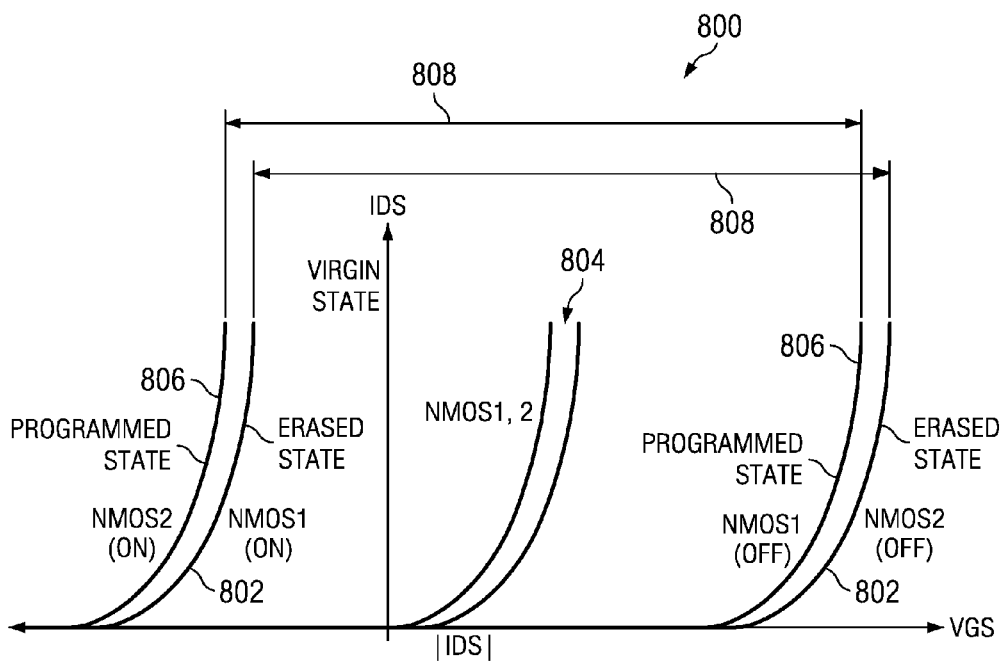
FIG. 8 is a voltage versus current graph illustrating curves for different states of a conventional cross coupled EEPROM cell.
Figure 9:
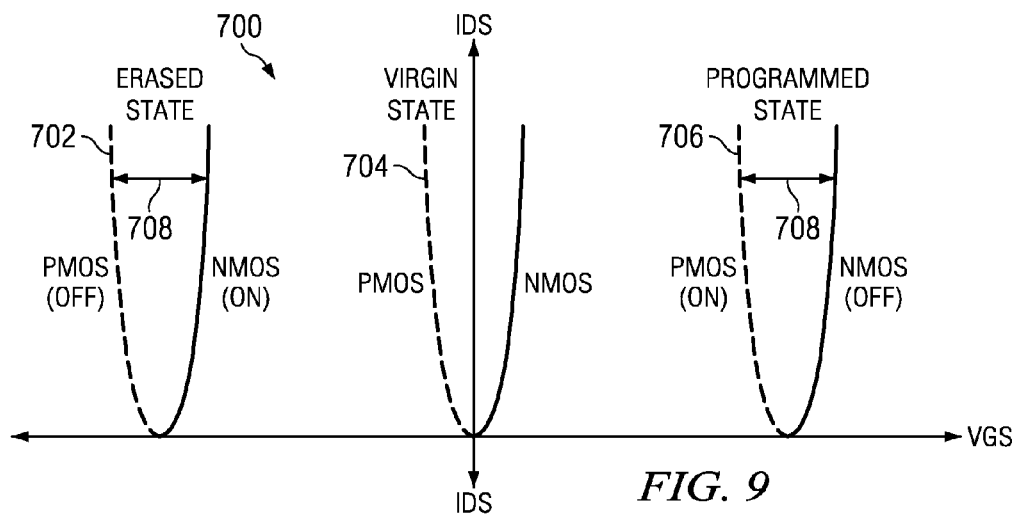
FIG. 9 is a voltage versus current graph illustrating exemplary curves for different states of a non cross coupled EEPROM cell according to one or more aspects of the present invention relative to the curves of the conventional cross coupled EEPROM of FIG. 8.

FIGS. 8 and 9 are graphs providing a comparison of a conventional cross coupled EEPROM and an EEPROM as described herein. More particularly, FIG. 8 is a voltage versus current graph 800 illustrating respective curves 802, 804, 806 for erased, virgin and programmed states of a conventional cross coupled EEPROM cell, while the graph 700 in FIG. 9 illustrates respective curves 702, 704, 706 for erased, virgin and programmed states of an EEPROM as described herein (e.g., as in FIG. 7). It can seen that a first nmos device (nmos1) is on while a second nmos device (nmos2) is off in the erased state 802 of the conventional arrangement 800. Conversely, the first nmos device (nmos1) is off while the second nmos device (nmos2) is on in the programmed state 806 of the conventional arrangement 800. This provides for a relatively good read margin since the state of the cell is determined by subtracting the current in the second nmos transistor (Inmos1) from the current in the first nmos transistor (Inmos2). More particularly, the 'distance' or difference 808 between the different transistors is relatively wide in this arrangement. The read margin 708 is similarly determined in the disclosed EEPROM by subtracting the current in a pmos device (Ipmos) from the current in an nmos device (Inmos).

Figure 10:
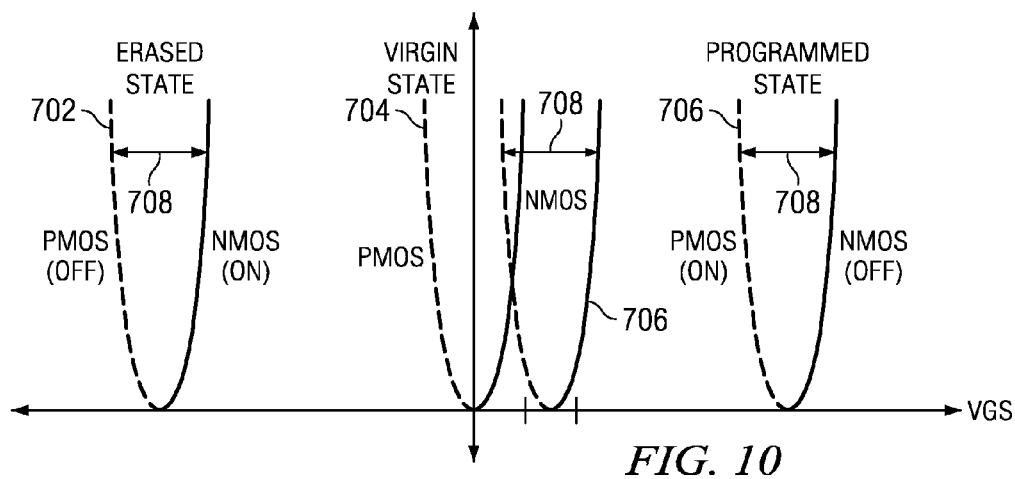
FIG. 10 is a voltage versus current graph illustrating the effect of curve shifting for a non cross coupled EEPROM cell in accordance with one or more aspects of the present invention.
Figure 11:
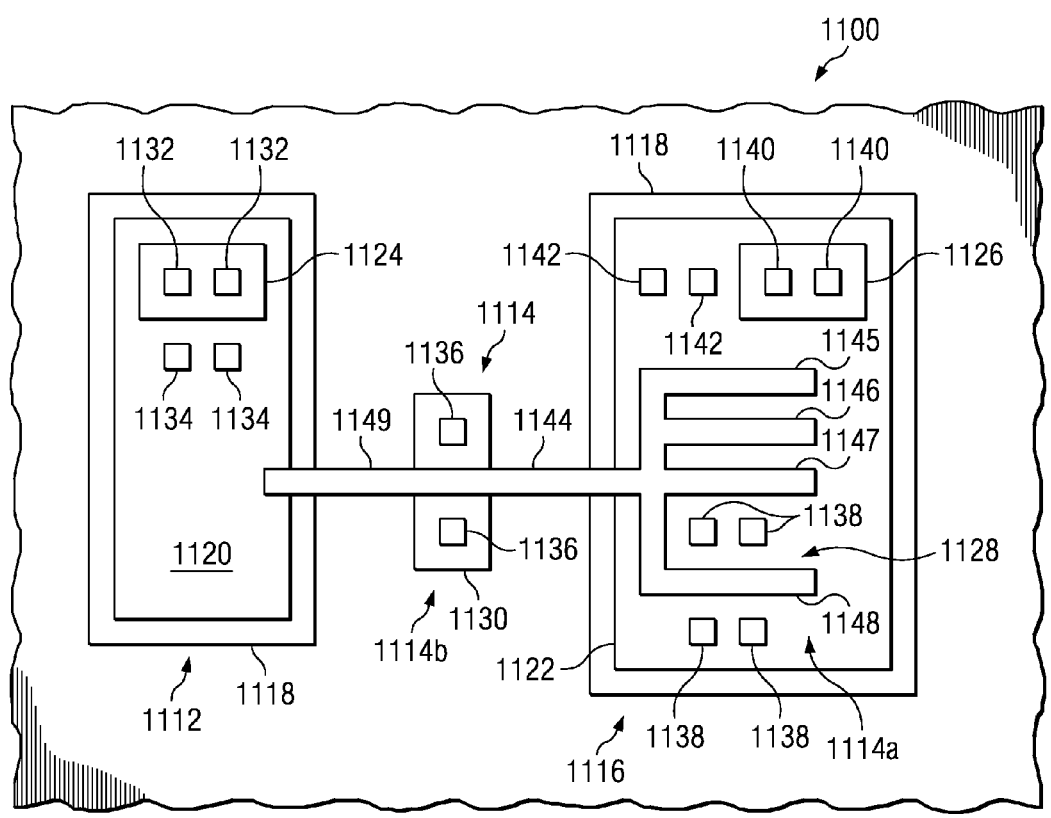
FIG. 11 is a top plan view illustrating another exemplary non cross coupled EEPROM cell according to one or more aspects of the present invention.

With regard to the proposed EEPROM, since the state of the cell is determined by subtracting the current in a pmos device (Ipmos) from the current in an nmos device (Inmos), the shape of the curves 702, 706 do not change as a function of transistor wear. Rather, the erased and/or programmed curves 702, 706 merely move along the x axis in the event of device wear. This is illustrated in FIG. 10, where the programmed curve 706 is illustrated as moving toward the origin or virgin state 704. The shape of the curve 706, however, remains unaffected so that the read margin 708 remains relatively constant. In this manner, the disclosed EEPROM enhances data retention and read/write endurance while concurrently being formed in an area efficient manner. Additionally, a so called 'dead window' is made smaller when low VT read transistors are used, which can be particularly beneficial toward the end of the product lifetime. The EEPROM can be readily incorporated into an existing or baseline CMOS fabrication process so as to be produced in an efficient and cost effective manner. Multiple memory cells can be operatively coupled to one another to form arrays of desired dimensions Turning to FIG. 11, a top plan view illustrates another exemplary non cross coupled EEPROM cell 1100 according to one or more aspects of the present invention, where the EEPROM 1100 is more area efficient than conventional cross coupled arrangements but remains robust against charge loss and wear out. The cell 1100 again comprises a tunneling region 1112, a read transistor 1114 and a control region 1116, where all three of these regions are formed upon a semiconductor substrate (not shown). The read transistor 1114 generally comprises low voltage pmos transistor 1114a and nmos transistor 1114b portions. As will be discussed further, however, in this arrangement the pmos transistor portion 1114a of the read transistor 1114 can be said to be comprised within the control region 1116.

The tunneling region 1112 and the control region 1116 are formed within an n well 1118 in the substrate. Within the n well 1118, the tunneling region 1112 and the control region 1116 have respective p moats 1120, 1122 and n moats 1124, 1126. The nmos transistor portion 1114b of the read transistor 1114 has an n moat 1130. In this arrangement, however, a p moat 1128 of the pmos transistor portion 1114a of the read transistor 1114 is formed within or resides within the control region 1116, and more particularly the p moat 1122 of the control region 1116.

One or more respective contacts 1132, 1134 are formed within the tunneling region 1112 to provide a mechanism for operatively coupling to the n and p moats 1124, 1120, respectively. Likewise, one or more contacts 1136, 1138 and 1140, 1142 are similarly formed within the read transistor 1114 and the control region 1116 to provide for operatively coupling to the respective n and p moats 1130, 1128 and 1126, 1122 of these regions 1114, 1116. This, for example, allows source and drain regions of the pmos and nmos transistor portions 1114a, 1114b of the read transistor 14 to be contacted.

Finally a patterned layer of semiconductor material 1144 is established between the tunneling region 1112, the read transistor 1114 and the control region 1116. More particularly, the patterned layer of semiconductor material 1144 operatively couples the p moat regions 1120, 1122 of the tunneling region 1112 and the control region 1116 to one another through the read transistor 1114. In the illustrated example, the patterned layer of semiconductor material 1144 has four 'fingers' 1145, 1146, 1147, 1148 in the control region 1116. The fingers can have dimensions similar to that described above with respect to FIG. 5. In this configuration the fourth finger 1148 serves as a gate electrode for the pmos transistor 1114a, while a trunk or shaft portion 1149 of the semiconductor material 1144 serves as a gate electrode for the nmos transistor 1114b. The patterned layer of semiconductor material 1144 can comprise any suitable materials, such as a polysilicon based material, for example.

Figure 12:
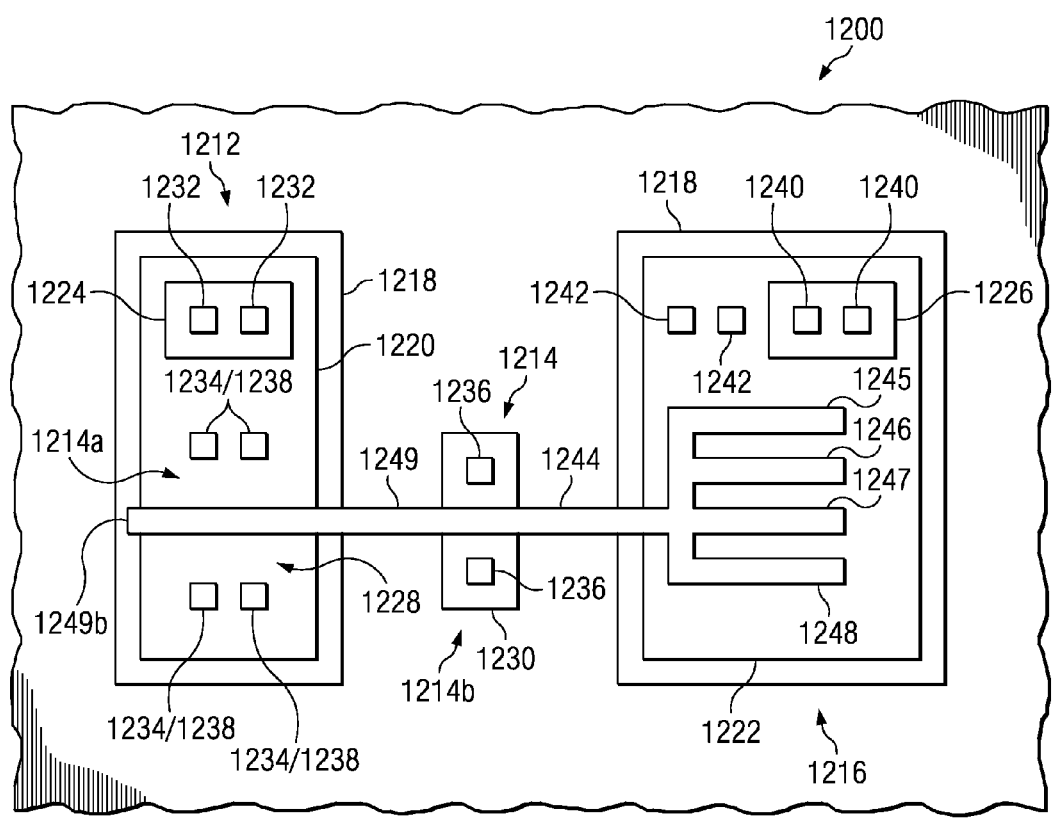
FIG. 12 is a top plan view illustrating yet another exemplary non cross coupled EEPROM cell according to one or more aspects of the present invention.

FIG. 12 is a top plan view illustrating yet another exemplary non cross coupled EEPROM cell according to one or more aspects of the present invention, where the EEPROM 1200 is robust against charge loss and wear out while being more area efficient than conventional cross coupled arrangements. The cell 1200 comprises a tunneling region 1212, a read transistor 1214 and a control region 1216, where all three of these regions are formed upon a semiconductor substrate (not shown). The read transistor 1214 generally comprises low voltage pmos transistor 1214a and nmos transistor 1214b portions. As will be discussed further, in this arrangement the pmos transistor portion 1214a of the read transistor 1214 can be said to be comprised within the tunneling region 1212.

The tunneling region 1212 and the control region 1216 are formed within an n well 1218 in the substrate. Within the n well 1218, the tunneling region 1212 and the control region 1216 have respective p moats 1220, 1222 and n moats 1224, 1226. The nmos transistor portion 1214b of the read transistor 1214 has an n moat 1230. In this arrangement, however, a p moat 1228 of the pmos transistor portion 1214a of the read transistor 1214 is formed within or resides within the tunneling region 1212, and more particularly the p moat 1220 of the tunneling region 1212.

One or more respective contacts 1232, 1234 are formed within the tunneling region 1212 to provide a mechanism for operatively coupling to the n and p moats 1224, 1220, respectively. Likewise, one or more contacts 1236, 1238 and 1240, 1242 are similarly formed within the tunneling region 1212, the read transistor 1214 and the control region 1216 to provide for operatively coupling to the respective n and p moats 1230, 1228 and 1226, 1222 of these regions 1212, 1214, 1216. This, for example, allows source and drain regions of the pmos and nmos transistor portions 1214a, 1214b of the read transistor 14 to be contacted.

A patterned layer of semiconductor material 1244 is established between the tunneling region 1212, the read transistor 1214 and the control region 1216. More particularly, the patterned layer of semiconductor material 1244 operatively couples the p moat regions 1220, 1222 of the tunneling region 1212 and the control region 1216 to one another through the read transistor 1214. In the illustrated example, the patterned layer of semiconductor material 1244 has four 'fingers' 1245, 1246, 1247, 1248 in the control region 1216. The fingers can have dimensions similar to that described above with respect to FIG. 5. In this configuration, a handle or shaft portion 1249 of the semiconductor material serves 1244 as a gate electrode for the nmos transistor 1214b, while an end portion 1249a of this trunk or shaft portion 1249 serves as a gate electrode for the pmos transistor 1214a. The patterned layer of semiconductor material 1244 can comprise any suitable materials, such as a polysilicon based material, for example. It will be appreciate that, as presented in the illustrated example, since the pmos transistor portion 1214a of the read transistor 1214 is generally comprised within the p moat 1220 of the tunneling region 1212, one or more contacts within that p moat region 1220 can facilitate contacting that p moat region 1220 as well as the p moat 1228 of the pmos transistor portion 1214a of the read transistor 1214.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that devices, layers, features and/or elements depicted herein are illustrated with particular dimensions relative to one another (e.g., layer to layer dimensions and/or orientations) for purposes of simplicity and ease of understanding, and that actual dimensions of the same may differ substantially from that illustrated herein. Additionally, these items can be formed in any number of suitable ways, such as with spin-on techniques, sputtering techniques (e.g., magnetron or ion beam sputtering), (thermal) growth techniques and/or deposition techniques such as chemical vapor deposition (CVD), for example.

What is claimed is:

1. An electrically erasable programmable read only memory (EEPROM), comprising:
   a tunneling region;
   a read transistor operatively coupled to the tunneling region; and
   a control region operatively coupled to the read transistor, where the read transistor comprises;
   a pmos transistor portion, and
   an nmos transistor portion, wherein the state of the EEPROM is determined differentially by comparing a current developed in the nmos transistor portion to a current developed in the pmos transistor portion.

2. The EEPROM of claim 1, wherein the pmos current is subtracted from the nmos current.

3. The EEPROM of claim 1, further comprising:
a patterned layer of semiconductor material that operatively couples the tunneling region and the control region to the read transistor.

4. The EEPROM of claim 3, wherein the tunneling region comprises a p moat region and an n moat region, and the control region comprises a p moat region and an n moat region.

5. The EEPROM of claim 4, wherein the patterned layer of semiconductor material extends over a small portion of the p moat of the tunneling region and over a substantially greater portion of the p moat of the control region.

6. The EEPROM of claim 5, wherein the pmos transistor portion of the read transistor comprises a p moat, and the nmos transistor portion of the read transistor comprises an n moat.

7. The EEPROM of claim 6, wherein the patterned layer of semiconductor material extends over the p moat of the pmos transistor portion and thereby serves as a gate electrode of the pmos transistor portion, and wherein the patterned layer of semiconductor material extends over the n moat of the nmos transistor portion and thereby serves as a gate electrode of the nmos transistor portion.

8. The EEPROM of claim 7, wherein the tunneling region, the pmos transistor portion of the read transistor and the control region are formed within one or more n well regions within a semiconductor substrate.

9. The EEPROM of claim 8,
wherein the tunneling region comprises one or more contacts for contacting the p moat region and the n moat region of the tunneling region,
wherein the read transistor comprises one or more contacts for contacting the p moat region and the n moat region of the read transistor and
wherein the control region comprises one or more contacts for contacting the p moat region and the n moat region of the control region.

10. The EEPROM of claim 9,
wherein the pmos transistor portion of the read transistor comprises one or more contacts on either side of the portion of the patterned layer of semiconductor material that extends over the p moat of the pmos transistor portion of the read transistor, and
wherein the nmos transistor portion of the read transistor comprises one or more contacts on either side of the portion of the patterned layer of semiconductor material that extends over the n moat of the nmos transistor portion of the read transistor.

11. The EEPROM of claim 10, wherein the one or more contacts of the pmos transistor portion and of the nmos transistor portion allow respective source and drain regions of the pmos transistor portion and of the nmos transistor portion to be contacted.

12. The EEPROM of claim 10, wherein at least one of:
the read transistor comprises one or more low voltage transistors,
the pmos transistor portion is off in an erased state,
the nmos transistor portion is on in an erased state,
the pmos transistor portion is on in a programmed state,
the nmos transistor portion is off in a programmed state,
the patterned layer of semiconductor material comprises a plurality of fingers over the p moat of the control region,
the patterned layer of semiconductor material comprises polysilicon, and
the pmos transistor portion and the nmos transistor portion are arranged in a non cross coupled arrangement.

13. A non cross coupled electrically erasable programmable read only memory (EEPROM), comprising:
a tunneling region;
a read transistor operatively coupled to the tunneling region; and
a control region operatively coupled to the read transistor, where the read transistor comprises:
a pmos transistor portion, and
an nmos transistor portion; wherein the pmos transistor portion is formed within a p moat of the control region.

14. A non cross coupled electrically erasable programmable read only memory (EEPROM), comprising:
a tunneling region;
a read transistor operatively coupled to the tunneling region; and
a control region operatively coupled to the read transistor, where the read transistor comprises:
a pmos transistor portion, and
an nmos transistor portion; wherein the pmos transistor portion is formed within a p moat of the tunneling region.

15. A non cross coupled electrically erasable programmable read only memory (EEPROM), comprising:
a tunneling region that comprises a p moat region and an n moat region;
a read transistor operatively coupled to the tunneling region, and that comprises a pmos transistor portion that comprises a p moat region, and an nmos transistor portion that comprises an n moat region;
a control region operatively coupled to the read transistor, and that comprises a p moat region and an n moat region; and
a patterned layer of semiconductor material that operatively couples the tunneling region and the control region to one another through the read transistor.

16. The EEPROM of claim 15, wherein at least one of;
the state of the EEPROM is determined differentially by comparing a current developed in the nmos transistor portion to a current developed in the pmos transistor portion,
the patterned layer of semiconductor material extends over a small portion of the p moat of the tunneling region and over a substantially greater portion of the p moat of the control region,
the patterned layer of semiconductor material extends over the p moat of the pmos transistor portion and thereby serves as a gate electrode of the pmos transistor portion,
the patterned layer of semiconductor material extends over the n moat of the nmos transistor portion and thereby serves as a gate electrode of the nmos transistor portion,
the tunneling region, the pmos transistor portion of the read transistor and the control region are formed within one or more n well regions within a semiconductor substrate,
the tunneling region comprises one or more contacts for contacting the p moat region and the n moat region of the tunneling region,
the read transistor comprises one or more contacts for contacting the p moat region and the n moat region of the read transistor, and
the control region comprises one or more contacts for contacting the p moat region and the n moat region of the control region.

17. The EEPROM of claim 10, wherein at least one of:
the pmos transistor portion of the read transistor comprises one or more contacts on either side of the portion of the patterned layer of semiconductor material that extends over the p moat of the pmos transistor portion of the read transistor, the one or more contacts allowing respective source and drain regions of the of the pmos transistor portion to be contacted, the nmos transistor portion of the read transistor comprises one or more contacts on either side of the portion of the patterned layer of semiconductor material that extends over the n moat of the nmos transistor portion of the read transistor, the one or more contacts allowing respective source and drain regions of the of the nmos transistor portion to be contacted, the read transistor comprises one or more low voltage transistors, the pmos transistor portion is off in an erased state, the nmos transistor portion is on in an erased state, the pmos transistor portion is on in a programmed state, the nmos transistor portion is off in a programmed state, the patterned layer of semiconductor material comprises a plurality of fingers over the p moat of the control region, the patterned layer of semiconductor material comprises polysilicon, and the pmos transistor portion and the nmos transistor portion are arranged in a non cross coupled arrangement.

* * * * *